United States Patent [19]

Kuijsten

[11] 3,721,976

[45] March 20, 1973

[54] KEYBOARD CODING AND INTERLOCK SYSTEM

[75] Inventor: Han Kuijsten, Alameda County, Calif.

[73] Assignee: Omron Systems, Inc., Mount View, Calif.

[22] Filed: Feb. 1, 1971

[21] Appl. No.: 111,363

[52] U.S. Cl....340/365 S, 340/146.1 AB, 340/365 E, 178/17 R

[51] Int. Cl....H04q 3/00

[58] Field of Search......340/365, 347 DD, 146.1 AB, 340/365 S, 365 E; 179/90 K; 235/155; 178/17 R, 17 C

[56] References Cited

UNITED STATES PATENTS

| | | | |
|---|---|---|---|
| 3,573,807 | 4/1971 | Osborne | 340/365 |
| 3,284,773 | 11/1966 | Saykay | 340/365 |
| 3,493,928 | 2/1970 | Juliusburger | 340/365 |
| 3,551,616 | 12/1970 | Juliusburger | 340/365 |
| 3,307,148 | 2/1967 | Fukamachi | 340/347 DD |

*Primary Examiner*—John W. Caldwell
*Assistant Examiner*—Robert J. Mooney
*Attorney*—Harry E. Aine and William J. Nolan

[57] ABSTRACT

A keyboard coding and interlock system wherein the key switches are single contact, two terminal switches coupled to two sides of a logic circuit matrix with substantially fewer input lines than the number of key switches. Pulse means are provided for alternately sampling the input lines on each side of the matrix to determine the condition of the key switches and storage means are provided for producing a binary output indicating the open-closed condition of the switches. A decoding matrix fully decodes the output of the encoding logic matrix.

7 Claims, 4 Drawing Figures

PATENTED MAR 20 1973 3,721,976

INVENTOR

HAN KUIJSTEN

BY

ATTORNEY

KEYBOARD CODING AND INTERLOCK SYSTEM

BACKGROUND OF THE INVENTION

In practically all keyboard actuated devices, there is included a mechanism for preventing repetitious cycling when a key is depressed and then held down. Also, means are incorporated for preventing a multiple registration when two keys are depressed simultaneously or when a second key is depressed at a time when a first key is still down, i.e., two key roll-over, a common problem with key operators.

One form of two key roll-over mechanism is mechanical in nature, including motor drives and the like, but such devices are not desirable. Other solutions employ electronic circuitry which, although more desirable than mechanical devices, are more complex or expensive than required.

In one electronic system, all of the key switch lines are brought to the registering system without encoding, and logic circuitry is provided for producing a desired inhibit signal whenever two or more keys are depressed simultaneously. A large amount of logic is required for this system; for example for a 16 key keyboard, 120 two-input gates are required.

A more desireable known system utilizes a restricted code, such as a two-out-of-*n* code, where *n* is the number of lines as determined by the number of keys, N. That is, $N = n(n-1)/2$. This known system has the disadvantage of requiring either multiple contact switches or diodes for each key. For example, if a two-out-of-seven code were selected for a 20 key keyboard, either 20 double contact switches or 20 single contact switches and 40 diodes are required for the system.

BRIEF SUMMARY OF THE INVENTION

The present invention provides an electronic key interlock system requiring only single contact key switches while retaining the advantage of a reduced number of input lines to the logic circuitry.

The key switches are separated into a plurality of groups, with one terminal of each switch being coupled to the input lines of one side of a logic matrix and the other terminal of each switch being coupled to the input lines of another side of the matrix. Each of the key switches in a separate group have one of their terminals coupled in common to an associated one of the input lines of said one side, and have their other terminals coupled to different ones of the input lines in the other side of the matrix. A pulse circuit is provided for sequentially sampling first the input lines of one side of said matrix and then the input lines of the other side of the matrix to determine the one-off state of all of the key switches, each sampling cycle being short compared to the normal depression time of a key. Storage circuits in the form of flip-flops are coupled to each input line in the matrix, the combination of two flip-flops coupled to two input lines, one on each side of the matrix, serving to register the condition of an associated key switch. Each key switch utilizes a different combination of two flip-flops.

A decoding matrix is utilized to decode the instantaneous state of the flip-flops to register the key condition. A one state on any pair of flip-flops will result in an associated key register. A one state on any two or more pairs will result in no key register. Thus, one key depressed will register; a second key depressed during the one key activation will produce a "no key depressed" registration; release of the first key depressed will result in registration of the remaining key depressed and thus compensate for two key roll-over.

The number of keys in the keyboard will determine the number of input lines to the logic matrix. By increasing the number of time periods in the sampling cycle, the number of logic input lines per keyboard size may be reduced.

DESCRIPTION OF THE PREFERRED EMBODIMENTS

Figures 1, 2, 3, 4:
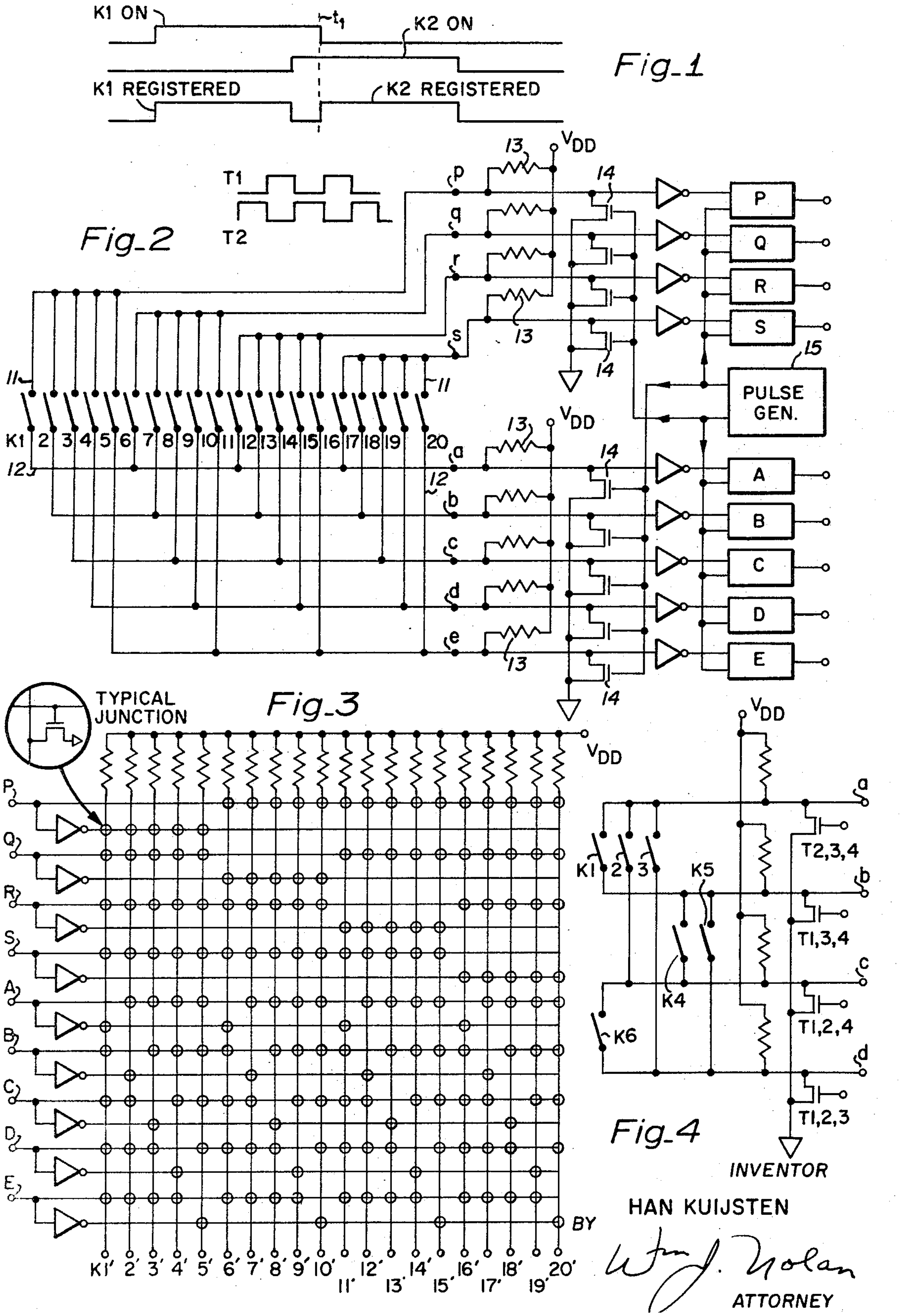
FIG. 1 is a pulse chart illustrating the two key roll-over condition encountered in keyboard operation.
FIG. 2 is a schematic diagram of a preferred embodiment of the present invention utilizing a 5×4 logic matrix for a 20 key keyboard.
FIG. 3 is a schematic diagram of one form of decoder matrix useful with the system of FIG. 2.
FIG. 4 is an embodiment of the invention utilizing an expanded number of timing pulses in the sampling cycle.

Referring now to FIG. 1, the problem of two key roll-over occurs when a second key, K2, is depressed during the period when a first key, K1, is already depressed. In known devices, the second key operation will not be registered until the time, $t_1$, that the first key has returned to normal. Thus multiple registration is avoided and key information is not skipped.

One embodiment of the present invention for accomplishing this desired result with a minimum of input lines to the logic circuitry package is shown in FIG. 2. The keyboard includes 20 key switches K1–K20, each being single contact and having two terminals 11 and 12. The key switches are arranged in four groups K1–K5, K6–K10, K11–K15, K16–K20. The terminals 11 of each key in a group are coupled in common, the terminals in each group K1–K5, K6–K10, K11–K15, and K16–K20 being coupled to an associated one of four input lines, *p*, *q*, *r* and *s*, respectively, of one side of a logic matrix. One of the terminals 12 in each different key group is coupled in common to one input line *a*, *b*, *c*, *d*, and *e* of the other side of the matrix; e.g., key switches K1, K6, K11 and K16 are coupled in common to line *a*, key switches K2, K7, K12 and K17 to line *b*, etc. Each of the nine matrix input lines *a-e* and *p-s* is coupled through an associated resistor 13 to voltage $V_{DD}$.

Each of the nine input lines is also coupled to one input of an associated MOS switch 14, the other input of each MOS being connected to ground. The gates of each MOS coupled to the input lines *a-e* are coupled to a pulse generator 15 providing timing pulses T1 with equal hi and lo times. The gates of each MOS switch coupled to the input lines *p-s* are coupled to the pulse generator 15 and receive timing pulses T2 with hi-lo periods alternating with the T1 pulses. Thus, during the on times of pulse T1, all of the five input lines *a-e* are grounded and, during the on times of pulse T2, all of the four input lines *p-s* are grounded.

Each of the nine input lines *a-e* and *p-s* is coupled via inverters to one input of an associated flip-flop circuit A-E and P-S in a nine flip-flop storage system. The other inputs of the flip-flops A-E are coupled in common to the source of timing pulses T2 while timing pulses T1 are coupled to the second inputs of the four flip-flops P-S.

In operation, during each on time of pulse T1, a period very short compared to the normal depress time of any key, ground is connected via the MOS switches to each of lines *a-e*. If a key is closed at any time during this pulse, an associated flip-flop will be operated. For example, if key K1 is closed, the ground on line *a* is coupled to the line *p* and a hi occurs on the output of the inverter to one input of the flip-flop P. Since the other input also has the hi from pulse T1 connected thereto, the output of flip-flop P goes hi. Then, during the next pulse T2, the ground connected to line p via its associated MOS switch is coupled via switch K1 to line a, and the output of the associated inverter goes hi to flip-flop A. The other input of flip-flop A is hi from pulse T2 and the output of flip-flop A goes hi. Thus, a closed K1 will result in operation of one flip-flop in each side of the matrix, namely flip-flops P and A. The following chart designates the two flip-flops operated for each key depressed, as well as the pulse (T1 or T2) which initiates operation of the flip-flop.

| | FLIP-FLOPS | |
|---|---|---|
| KEY | T1 | T2 |
| K1 | P | A |
| K2 | P | B |
| K3 | P | C |
| K4 | P | D |
| K5 | P | E |
| K6 | Q | A |
| K7 | Q | B |
| K8 | Q | C |
| K9 | Q | D |
| K10 | Q | E |
| K11 | R | A |
| K12 | R | B |
| K13 | R | C |
| K14 | R | D |
| K15 | R | E |
| K16 | S | A |
| K17 | S | B |
| K18 | S | C |
| K19 | S | D |
| K20 | S | E |

Thus, for each key depressed, a different pair of flip-flops is operated, one from each side of the matrix. This particular code is accomplished with only nine input leads to the matrix from twenty single contact switches. This matrix is very simple and may be easily expanded to accommodate additional keys; for example a 100 key keyboard would employ a 10 × 10 matrix. It is desired wherever possible to utilize standard logic packages and to keep the number of lines to the matrix to the lowest possible number conforming with the available input pins on a standard logic package.

This coding may be fully decoded in a matrix of the type shown in FIG. 3 where the outputs from the flip-flops A-E and P-S are coupled to the inputs on the left hand side. A MOS switch of the type shown in FIG. 3*a* is provided at each intersection of the horizontal and vertical lines of the matrix designated by a circle. Assuming K1 is depressed, lines P and A to the decoder matrix are hi and all the other inputs are lo. The gates of the MOS switches at the junctions of output line K1′ are lo at lines Q,R,S,B,C,D, and E. The gates at the junctions at lines A and P are both lo via the associated inverters and thus all the MOS switches associated with output line K1′ are off and a hi appears on line K1′ to signify operation of key K1. All of the other lines K2′–K20b′ will have ground coupled thereto via one of the junctions, signifying an open at the associated key switches K2–K20, respectively. For example, with line P hi, the MOS switches at the junctions of line P with lines K6′–K20′ are operated to ground lines K6′–K20′. A hi on line A activates the MOS switches at the junction of line A with lines K2–K5 to ground these output lines.

Should two keys be operated at any point in time, then at least three of the flip-flops P-S, A-E will be operated. For example, if K2 is operated while K1 is operated, then the output of flip-flop B will go high along with the outputs of flip-flops P and A. Should key K15 be operated while key K1 is closed, then flip-flops R and E will be operated along with flip-flops P and A.

With these additional one or more flip-flops operated, at least one more input line to the decoder will be high, and the output line K1′–K20′ that had a high appearing thereon will now be grounded to give a "no key depressed" output. For example, assuming key K1 was depressed and hi appearing on the outputs of flip-flops P and A resulted in a hi on the output K1′ of the decoder as described above, a hi thereafter appearing on any other input line Q-S or B-E will operate the associated MOS switch to ground the output lead K1′.

When switch K1 is later released, the other depressed key will then be registered on the appropriate output lead K2′–K20′.

In the above embodiment two alternating pulses, T1 and T2, were utilized to sample the two sets of key lines. This arrangement may be extended to multiple time slots as illustrated in FIG. 4, a technique useful for large keyboards since it allows more switches to be used for a given number of logic circuit input lines, although the logic circuitry becomes more complex.

In this embodiment, six switches, K1–K6, are shown connected to a particular combination of two lines out of four lines *a-d*. Four sampling times, T1–T4, are used, one sampling period for each of the four lines. Thus, during time T1 lines *b-d* are grounded, during time T2 lines *a*, *c* and *d* are grounded, during time T3 lines *a*, *b*, and *d* are grounded, and during time T4 lines *a*,*b*, and *c* are grounded. During time T1 line a is interrogated, during time T2 line *b* is interrogated, etc.

If no switches K1–K6 are closed, each of the input lines *a-d* to the logic circuitry will exhibit a logic one during the sampling time. If one of the switches is closed, an associated pair of input lines is grounded; for example, in the case of key K1 line a will remain grounded during time T1 from the MOS at the junction of line *b* and line *b* will remain grounded during time T2 from the MOS at the junction of line *a*. Should both keys K1 and K2 be closed, lines *a*, *b* and *c* will remain grounded during times T1, T2 and T3, respectively. Thus, multiple key depressions may be differentiated from single key depressions as in the embodiment of FIG. 2.

What is claimed is:

1. A keyboard coding system comprising a plurality of key circuits each comprising a single contact, two terminal switch, said switches being arranged in a plurality of groups, a logic circuit matrix comprising a plurality of groups of input lines, each of said key switches in a key switch group having a first terminal coupled in common to a particular input line in one of said groups of input lines and having a second terminal coupled to a particular input line in the other group of input lines, the second terminals of the key switches in each group being coupled to different ones of the lines in said second group of input lines, means for sampling each of said groups of input lines in succession to determine the open-closed state of the switches coupled to the input lines in said group, and means in said logic circuit for storing said switch state as binary logic.

2. A keyboard coding system as claimed in claim 1 wherein said sampling means comprises means for coupling on state potential to each input line and means for periodically coupling off state potential to each of said groups of input lines in sequence.

3. A keyboard coding system as claimed in claim 2 wherein said storage means comprises a plurality of binary storage circuits, one coupled to each separate input line, each storage circuit registering the condition of the key switches coupled via one terminal to its associated input line at the time the input line coupled to said key switch via its other terminal is connected to said off state potential.

4. A keyboard coding system as claimed in claim 1 wherein said plurality of groups of input lines comprises two groups.

5. A keyboard coding system as claimed in claim 1 wherein said sampling means comprises a pulse generator for producing a plurality of series of pulses, the pulses in said different series alternating in time, and switch means coupled to each group of input lines operated by said series of pulses to alternately ground said groups of lines in sequence, said storage means being coupled to each input line in each group for registering the ground condition of the line in the other group coupled thereto via the associated key switch when closed.

6. A keyboard coding system as claimed in claim 5 wherein said storage means comprises a flip-flop circuit coupled to each input line.

7. A keyboard coding system as claimed in claim 1 wherein said sampling means comprises a source of potential coupled to each of said input lines, a plurality of line switches, one being coupled to each input line and operable to connect ground to its associated line, timing means for operating the line switches coupled to said one group of input lines alternately with the line switches coupled to said other group of input lines whereby ground is coupled from the lines in one of said groups to the lines in the other of said groups via an associated key switch when closed, said storage means coupled to each input line in each group operating to register the ground condition transmitted to its associated input line via an associated closed key switch.

* * * * *